United States Patent
Wu

(10) Patent No.: US 6,846,596 B2
(45) Date of Patent: Jan. 25, 2005

(54) ALTERNATING PHASE SHIFT MASKING FOR MULTIPLE LEVELS OF MASKING RESOLUTION

(75) Inventor: Shao-Po Wu, Portola Valley, CA (US)

(73) Assignee: Numerical Technologies, Inc., Mountain View, CA (US)

( * ) Notice: Subject to any disclaimer, the term of this patent is extended or adjusted under 35 U.S.C. 154(b) by 160 days.

(21) Appl. No.: 10/240,006

(22) PCT Filed: Mar. 8, 2001

(86) PCT No.: PCT/US01/07413

§ 371 (c)(1),
(2), (4) Date: Sep. 26, 2002

(87) PCT Pub. No.: WO02/073312

PCT Pub. Date: Sep. 19, 2002

(65) Prior Publication Data

US 2003/0211401 A1 Nov. 13, 2003

(51) Int. Cl.[7] ............................. G03F 9/00; G06F 17/50
(52) U.S. Cl. ............................................. 430/5; 716/19
(58) Field of Search ........................... 430/5; 716/19–21

(56) References Cited

U.S. PATENT DOCUMENTS

| | | | |
|---|---|---|---|
| 6,420,074 B2 | 7/2002 | Wang et al. | 430/5 |
| 6,436,590 B2 | 8/2002 | Wang et al. | 430/5 |
| 6,584,610 B1 * | 6/2003 | Wu et al. | 716/19 |
| 2002/0083410 A1 | 6/2002 | Wa et al. | 716/19 |
| 2002/0127479 A1 | 9/2002 | Pierrat | 430/5 |
| 2002/0129327 A1 | 9/2002 | Pierrat et al. | 716/19 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

WO    WO 02/073312 A1    9/2002

OTHER PUBLICATIONS

Cooke, M., "OPC PSM Designs for Poly Gate Layers", European Semiconductor, vol. 22, No. 7, pp. 57–59, Jul. 2000.
Granik, Y., et al., "Sub–Resolution Process Windows And Yield Estimation Technique Based On Detailed Full–Chip CD Simulation", SPIE, vol. 4182, pp 335–341 (2000).
Plat, M., et al., "The Impact of Optical Enhancement Techniques on the Mask Error Enhancement Funchtion (MEEF)", SPIE, vol. 4000, pp. 206–214, Mar. 1–3, 2000.
Mansuripur, M., et al., "Projection Photolithography", Optics & Photonics News 11, 17 pages, Feb. 2000.

* cited by examiner

Primary Examiner—S. Rosasco
(74) Attorney, Agent, or Firm—Haynes Beffel & Wolfeld LLP

(57) ABSTRACT

A method and system produce alternating phase shift masks using multiple phase shift mask resolution levels for multiple feature classes. In one method, a pattern for a photolithographic mask that defines a layer is processed, The pattern defines features in multiple feature classes in the layer. For various feature resolution levels, layout dimensions for phase shift windows pairs are defined. The phase shift windows pairs are laid out with the layout dimensions. Phase shift values are assigned to the phase shift windows.

50 Claims, 5 Drawing Sheets

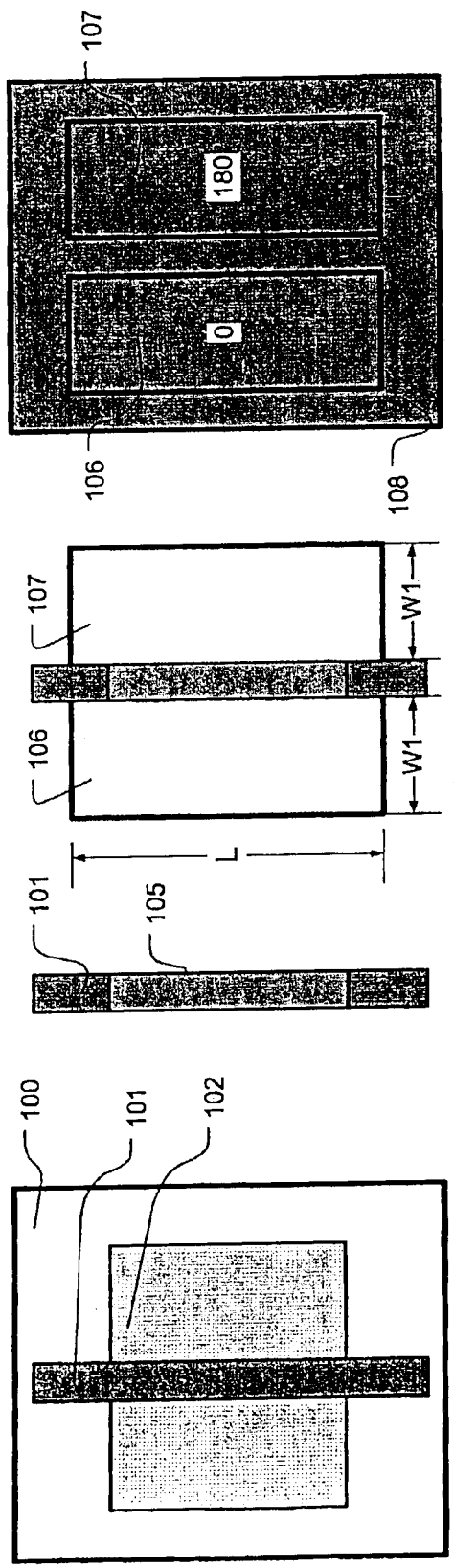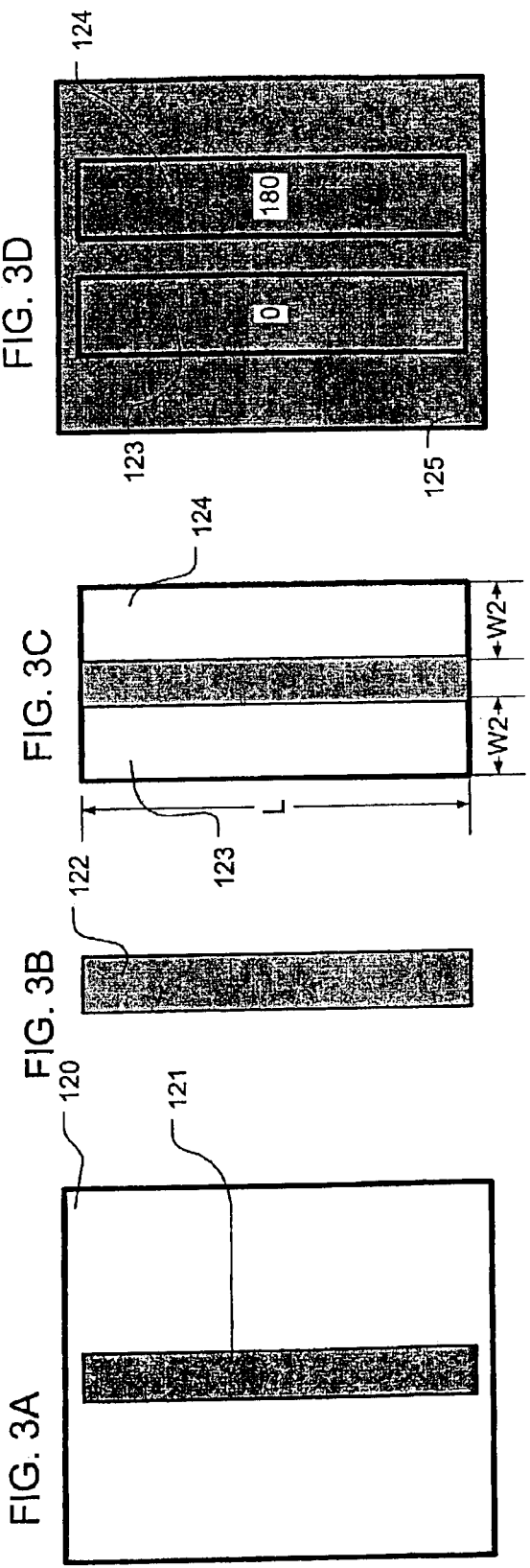

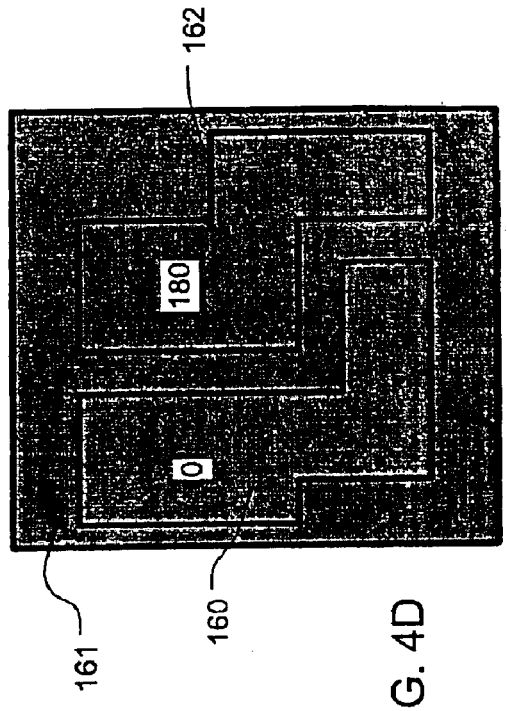
FIG. 4D
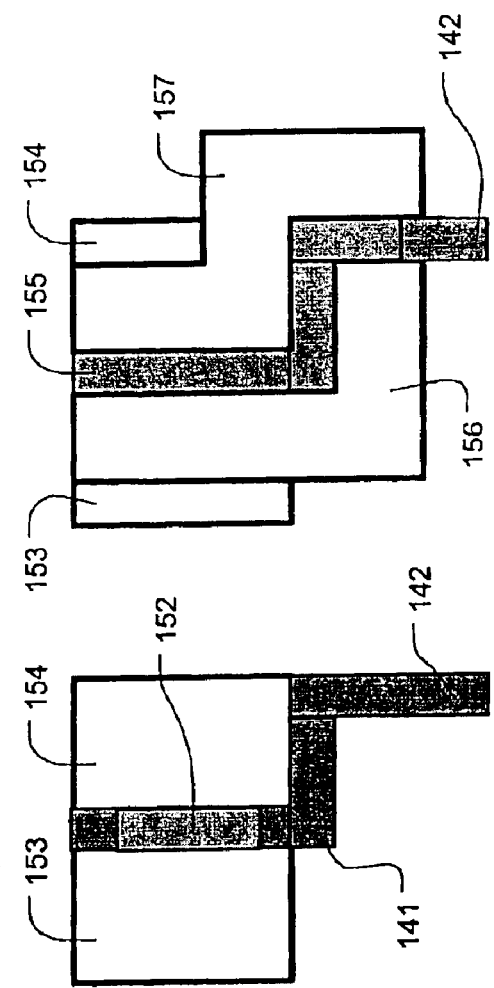
FIG. 4C
FIG. 4B
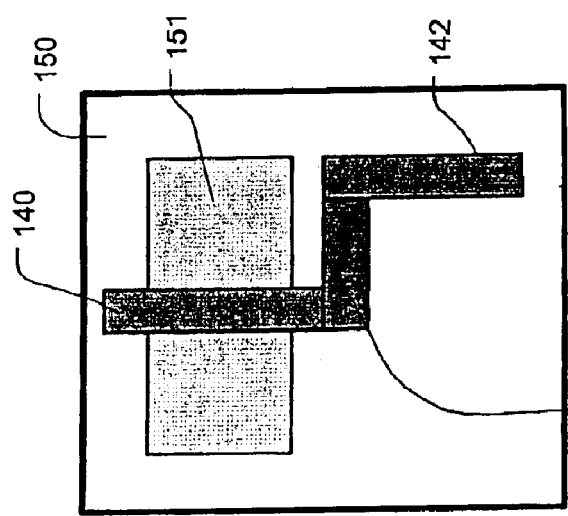
FIG. 4A

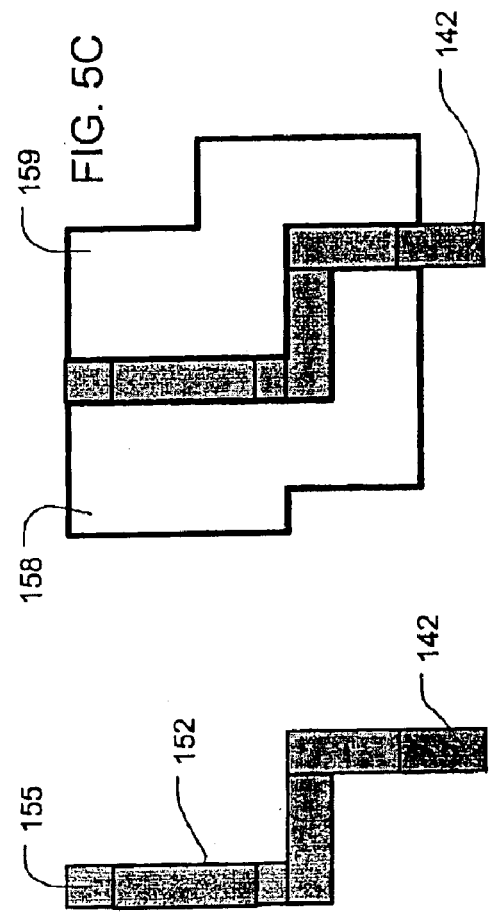
FIG. 5C
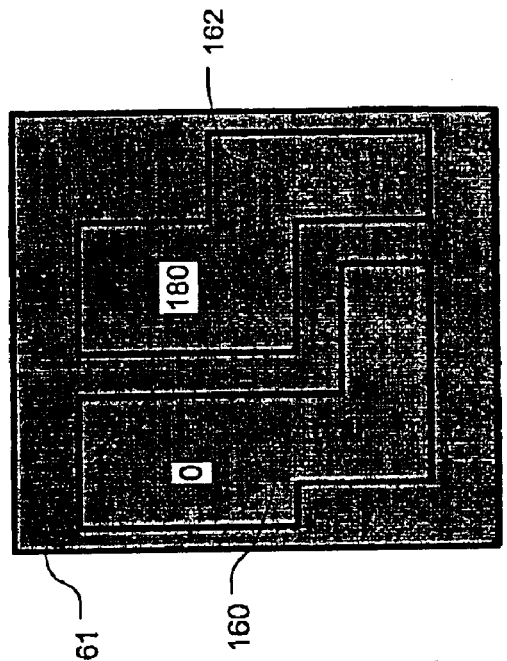
FIG. 5D
FIG. 5B
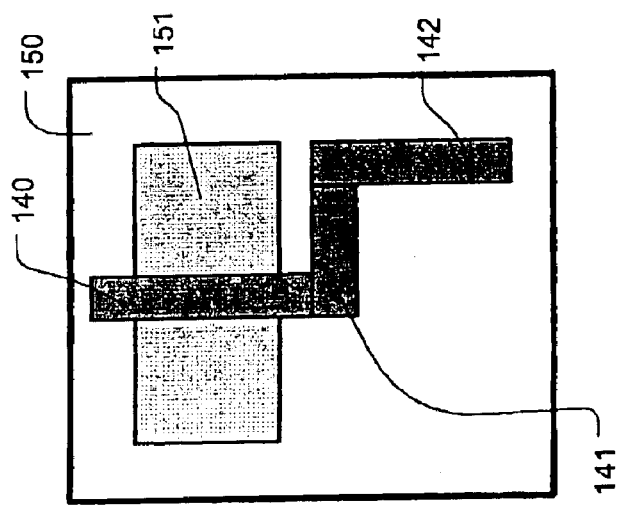
FIG. 5A

ALTERNATING PHASE SHIFT MASKING FOR MULTIPLE LEVELS OF MASKING RESOLUTION

BACKGROUND OF THE INVENTION

1. Field of the Invention

The present invention relates to manufacturing small dimension features of objects, such as integrated circuits, using photolithographic masks. More particularly, the present invention relates to the application of phase shift masking to complex layouts for integrated circuits and similar objects.

2. Description of Related Art

Phase shift masking, as described in U.S. Pat. No. 5,858,580, has been applied to create small dimension features in integrated circuits. Typically the features have been limited to selected elements of the design, which have a small, critical dimension. Although manufacturing of small dimension features in integrated circuits has resulted in improved speed and performance, it is desirable to apply phase shift masking more extensively in the manufacturing of such devices. However, the extension of phase shift masking to more complex designs results in a large increase in the complexity of the mask layout problem. For example, when laying out phase shift areas on dense designs, phase conflicts will occur. One type of phase conflict is a location in the layout at which two phase shift regions having the same phase are laid out in proximity to a feature to be exposed by the masks, such as by overlapping of the phase shift regions intended for implementation of adjacent lines in the exposure pattern. If the phase shift regions have the same phase, then they do not result in the optical interference necessary to create the desired effect. Thus, it is necessary to prevent inadvertent layout of phase shift regions in phase conflict. See, Wu, et al., "Alternating PSM Design and Its Implications to the Design-to-Manufacturing Flow," SAME 2000, Oct. 26, 2000.

Another problem with laying out complex designs which rely on small dimension features, arises because of isolated exposed spaces which may have a narrow dimension between unexposed regions or lines.

One factor which adds difficulty to the process of laying out complex patterns with phase shift masking arises because the width of the phase shift regions, in a direction orthogonal to the side between opposing phase regions, has a significant effect on the resulting image. If the width is too small, the line width of the resulting image may increase. If the width is too great, the size of the phase shifters for one feature begins to interfere with adjacent features in the layout. Further, if the adjacent features also involve the use of phase shift regions, unwanted phase conflicts may occur along the sides of the phase shift regions.

Because of these and other complexities, implementation of a phase shift masking technology for complex designs will require improvements in the approach to the design of phase shift masks, and new phase shift layout techniques.

SUMMARY OF THE INVENTION

The present invention provides a method and system for producing alternating phase shift masks using multiple phase shift mask resolution levels for multiple feature classes. The method in one embodiment, comprises:

processing a pattern for a photolithographic mask that defines a layer, wherein said pattern defines features in first and second feature classes in the layer;

defining first layout dimensions for phase shift window pairs for a first feature resolution level, and second layout dimensions for phase shift window pairs for a second feature resolution level;

laying out a plurality of phase shift window pairs, including using said first layout dimensions for phase shift window pairs for the first feature class, and using said second layout dimensions for phase shift window pairs for the second feature class; and assigning first and second phase shift values to phase shift windows in the plurality of phase shift window pairs.

In one embodiment said processing includes reading a layout file which identifies dimensions of the features in the pattern, and processing the layout file to identify features in the first and second feature classes. The features in the first feature class have line segments having a first line width, and correspond for example to transistor gates, and features in the second feature class have line segments having a second line width and correspond for example to narrow interconnect lines for connection to small transistor gates, the first line width being less than the second line width. In alternative examples the features may both be transistor gates for forming two classes of transistors characterized by slightly different channel lengths.

In one embodiment of the invention, an apparatus comprising the means for executing the process described above is provided.

The process in one embodiment results in the production of a set of masks for defining a layer of material in an integrated circuit or other work piece. The set of masks comprises a first mask having a plurality of phase shifting window pairs in an opaque field for defining respective phase shift window defined structures in the layer. The first mask has a plurality of phase shifting windows in an opaque field for defining respective phase-shift window defined structures in said layer. The phase shift windows in said plurality comprise respective first and second classes of windows, the first class baying a width dimension based upon a first layout width, and the second class having a width dimension based on a second layout width, said first layout width being greater than said second layout width.

A phase shift window has a width dimension based upon a layout width, when after overlying the phase shift window layouts with other features, and accounting for overlapping of phase shift areas with other phase shift areas, at least one segment of the width of the phase shift area has a width equal to the layout width.

The set of masks includes a second mask having second opaque areas and clear areas, said second opaque areas for defining an interconnect structure in said layer for interconnecting a plurality of the phase-shift window defined structures, and for preventing erasure of the phase-shift window defined structures.

In this manner, the images exposed by phase shift window pairs in a first class may have a smaller dimension than images exposed by the phase shift window pairs in a second class. The present invention is expandable to any number of classes of phase shift window characterized by differing widths, or other characteristics, and as a result of the differing characteristics, provides for the imaging of multiple classes of features with different resolutions.

In one embodiment, the present invention is a method that comprises processing a pattern for a photolithographic mask that defines a layer, wherein the pattern defines exposed regions and unexposed regions. Exposed regions in the pattern having a dimension less than a first feature size are identified as a first class of feature. Exposed regions in the pattern having a dimension less than a second feature size, larger than the first feature size are identified as a second class of feature. The plurality of phase shift window pairs are laid out for a first mask, as described above. Phase shift values for the respective first and second phase shift windows in the plurality of the phase shift window pairs are assigned.

According to another embodiment, the present invention comprises a data processing system including instructions and other resources for executing the process of laying out phase shift masks with multiple phase shift mask resolution levels for multiple feature classes as described above. In another embodiment, the present invention comprises an article of manufacture including a machine readable storage medium storing instructions for executing the process of laying out phase shift masks with multiple phase shift mask resolution levels for multiple feature classes as described above. In yet another embodiment, the present invention comprises a machine readable communication including instructions for executing the process of laying out phase shift masks with multiple phase shift mask resolution levels for multiple feature classes as described above.

The present invention provides methods and tools which increased flexibility of designers for manufacturing integrated circuits or other work pieces with very fine features characterized by the use of phase shift masking with multiple phase shifting resolution levels. Other aspects and advantages of the present invention can be seen upon review of the figures, the detailed description and claims which follow.

BRIEF DESCRIPTION OF THE FIGURES

FIGS. 2A–2D illustrate a conventional process for laying out a phase shift window pair for a transistor gate, or other feature class.

FIGS. 3A–3D illustrate the process for laying out a phase shift window pair for a feature of a feature class other than that shown in FIGS. 2A–2D.

FIGS. 4A–4D show the steps involved in laying out multiple feature classes in a single pattern, according to one embodiment of the present invention.

FIGS. 5A–5D show the steps involved in laying out multiple feature classes in a single pattern, according to another embodiment of the present invention.

DETAILED DESCRIPTION

Figure 1:
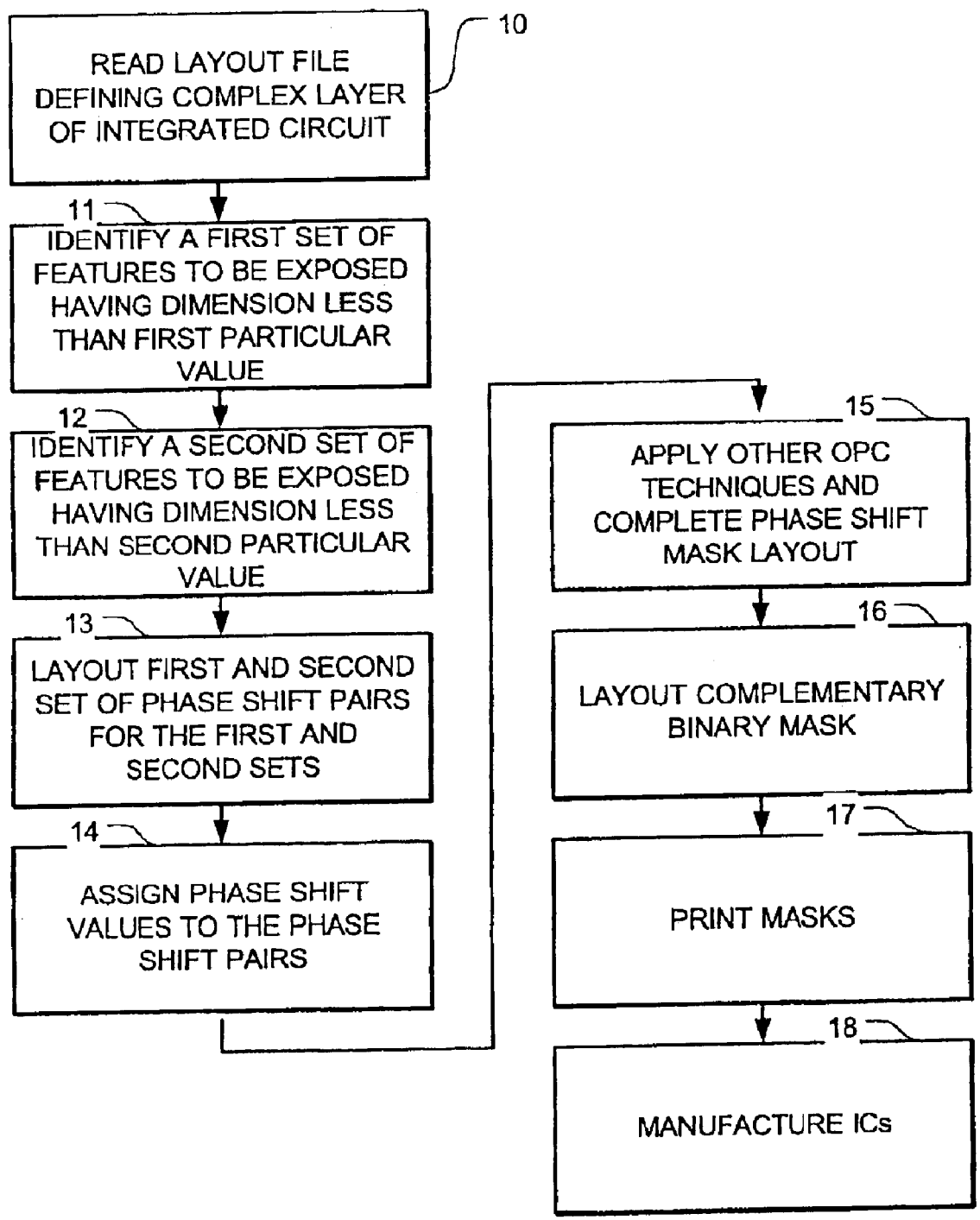
FIG. 1 is a flow chart of a layout process involving multiple shift mask resolution levels according to the present invention.

A detailed description of embodiments of the present invention is provided with respect to the figures. FIG. 1 illustrates the process executed by a computer system and a manufacturing system for laying out phase shift masks, producing complementary masks, printing such masks, and manufacturing integrated circuits using alternating phase shift masks with multiple phase shift resolution levels for multiple feature classes.

The process begins in this example with reading a layout file defining a complex layer of integrated circuit (step 10). For example, one such complex layer may comprise a polysilicon interconnect layer including transistor gate structures. Next, the process identifies a first set of features which are members of a first feature class. For example, features which have a dimension less than a first particular value are identified as a member of the first feature class, such as transistor gates (step 11). Next, a second set of features to be exposed in a second feature class is identified. For example features having a dimension less than a second particular value which is greater than the first particular value which characterized the first feature class are identified (step 12). First and second sets of shift window pairs which consist of phase shift windows having first and second layout dimensions are laid out for the first and second sets of features (step 13). The first and second sets of shift window dimensions are characterized by differing layout widths in a dimension orthogonal to sides of the phase transitions. Other layout dimensions of the phase shift windows may be varied to provide multiple resolution levels for the various feature classes, such as for example the widths of opaque areas along the phase transitions between phase shift windows in a pair. Next, phase shift values for the phase shift window pairs are assigned, or "colored" (step 14), providing that a first window in each pair has a θ degree phase shift and the second window in each pair has a (180+θ) degree phase shift, where θ is nominally zero degrees in one embodiment. Other optical proximity correction techniques, or other mask layout processes are executed to complete the phase shift mask layout process as known in the art (step 15). At this point, a machine readable layout file including phase shifting structures for multiple feature classes is produced. The complementary binary mask is laid out by which features exposed using the opaque field phase shift mask are interconnected in the layer (step 16). In a following step, the masks are printed or otherwise manufactured for use in exposing layers of material during manufacturing of the work piece such as the great circuit (step 17). Finally in a preferred system, integrated circuits are manufactured using the phase shift masks (step 18).

FIGS. 2A through 2D illustrate the layout of phase shift masks for a first class of features, in this example for transistor gates, which have a dimension less than the first particular value, such as a width which defines a channel length for a transistor of 0.12 microns or less in one example. FIG. 2A shows the appearance of a layout file defining the feature. Thus, the layer on an integrated circuit is defined within box 100. The transistor gate is defined by a line 101 of polysilicon. An implant region 102 provides the source and drain of the transistor and creates an active region of the transistor beneath the transistor gate defined by line 101. According to the present invention, phase shift windows are to be laid out to expose the region which will define the line 101 within the active region. Thus, in FIG. 2B, the region 105 which defines the transistor gate over the active region of the transistor, is identified. FIG. 2C shows phase shift windows 106 and 107 laid out adjacent the region 105. The phase shift windows 106 and 107 have a length L which is parallel to the feature 105 to be defined. For this class of feature, the phase shift windows 106 and 107 have a layout width W1, which is orthogonal to the side of the phase shift windows 106 and 107 at which the phase conflict is to induce exposure of the region 105. FIG. 2D shows the phase shift windows 106 and 107 after they have been "colored" or assigned phase shift characters of 0 degrees and 180 degrees respectively. The phase shift windows 106 and 107 are laid out in an opaque field 108 to define the phase shift mask. A complementary binary mask, not shown, is implemented to provide interconnect and other necessary structures for the layer of the device.

FIGS. 3A through 3D illustrate the layout of phase shift masks for a second class of features, in this example narrow interconnects, which have a dimension less than a second particular value, that may be greater than the first particular value which characterized the width of the transistor gates described with respect to FIGS. 2A through 2D. For example, where the first particular value is 0.12 microns, or less, the second particular value may be 0.15 microns or less. Thus, FIG. 3A shows a layer 120 of an integrated circuit with an interconnect feature 121. The interconnect feature 121 is determined to have a width of less than the second particular value. It is therefore a critical feature for the purposes of layout of phase shift masks for this second class of features. Thus, the critical feature 122 is defined in FIG. 3B. FIG. 3C shows layout of the phase shift windows 123 and 124 on opposing sides of the feature 122. In this example, the phase shift windows 123 and 124 have a layout width W2 which is less than the layout width W1 used in the sequence shown in FIG. 2C. FIG. 3D shows the phase shift regions 123 and 124 after they have been assigned relative phase shift values of 0 degrees and 180 degrees respectively. The phase shift regions 123 and 124 are laid out in an opaque field 125. A complementary binary mask (not shown) is used for interconnect and other features in the layer that do not rely on phase shifting.

Thus, with respect to FIGS. 2A through 2D and FIGS. 3A through 3D, it can be seen that multiple classes of phase shift features are defined. The widths of the resulting exposed patterns are based on the layout widths W1 and W2 of the phase shift windows. According to the present invention, a single phase shift mask is implemented in which multiple feature classes are accommodated using phase shift window pairs which have differing layout widths. In this manner, features which have wider dimensions, that can be implemented using narrower phase shift windows, can be combined on a single mask with features that have narrower dimensions and must be implemented using wider phase shift windows. Furthermore, the coloring of the combined shift regions is simplified over systems which rely on the single wider width or single class of phase shift feature.

FIGS. 4A through 4D illustrate the layout of a pattern which has multiple feature classes on a single mask. FIG. 4A shows a layer 150 of integrated circuit which has a polysilicon gate feature 140 and a polysilicon interconnect feature that includes segments 141 and 142. An implant 151 is shown in the figure representing the source and drain regions of a transistor having active channel region beneath the gate feature 140. In a first step of the process shown in FIG. 4B, the gate cell of the layout is identified and phase shift cells 153 and 154 are laid out in a manner that will define a gate region 152 using a layout width defined for the first feature class. In a next step shown in FIG. 4C, the critical feature cells which are defined as interconnect structures having a width less than a particular value, but greater than a gate width are identified. Phase shift cells 156 and 157 are laid out using a layout width defined for the second feature class overlying the phase shift cells 153 and 154, and along the sides of the feature 155. In this example, the layout width for the first feature class is greater than the layout width for the second feature class. The resulting phase shift windows have segments having widths which are based upon the layout widths for both of the feature classes, in the final window shape.

In FIG. 4D, the phase shift windows 160 and 162 are colored with their respective phase shift angles of 0 degrees 180 degrees as shown. The phase shift windows so colored are implemented in an opaque field 161. The phase shift windows are adjacent one another providing a phase transition, with opaque material such as chrome defining a spacing along the phase transition between the windows. Typically, the transition from the 0 degree to the 180 degree phase windows lies in the middle of the opaque strip between the windows. But the opaque strip between the windows allows other layouts.

A complementary binary mask (not shown) is added as discussed above for use in implementation of the layer of the work piece. In this manner, the phase shift cells 156 and 157 are implemented in a manner that does not prevent the region 142 from achieving necessary widths for the purposes of the layout. Likewise, the use of the narrower phase shift windows 156–157 simplifies the layout of the integrated circuit as a whole by reducing the chance of phase conflict with neighboring phase shift cells.

FIGS. 5A through 5D illustrate the layout of a pattern which has multiple feature classes on a single mask according to alternate process flow. FIG. 5A shows the layer 150 as in FIG. 4A of integrated circuit which has a polysilicon gate feature 140 and a polysilicon interconnect feature that includes segments 141 and 142. An implant 151 is shown in the figure representing the source and drain regions of a transistor having active channel region beneath the gate feature 140. In a first step of the alternate process shown in FIG. 5B, the gate cell 152 of the layout and the critical interconnect cells 155 of the layout are identified. In a next step shown in FIG. 5C, combined phase shifter cells 158 and 159 for both the first class of feature (gates) and the second class of feature (critical width interconnect lines) are laid out. This results in essentially the same layout as the combined cells shown in FIG. 4C. The final step a shown in FIG. 5D, the phase shift windows 160 and 162 are colored with their respective phase shift angles of zero degrees and 180 degrees as shown. The phase shifter cells, so colored, are implemented in opaque field 161. A complementary binary mask (not shown) is added as discussed above for use in implementation of the layer of the work piece.

In the opaque field 161 shown in FIGS. 4D and 5D, an opaque feature is laid out between the phase shift regions. The widths of the opaque feature between phase shift regions is adjustable, in addition to the adjustment of the widths of the phase shift windows themselves. Thus, the widths of the phase shift windows and the widths of the opaque feature between the phase shift windows can be manipulated to define multiple feature classes for layout of shift masks.

Layout of phase shift regions on a complex mask involve resolving overlapping phase shift areas, and the shapes of other features on the layer, such as lines which are cut at angles so that they overlay the layout dimensions of the phase shift areas. Thus the resulting mask will have phase shift windows that are not simple rectangles, but rather have complex polygon shapes. However, in one embodiment of the present invention, the phase shift windows for the first and second feature classes have width dimensions which are based upon different layout widths. A phase shift window has a width dimension based upon a layout width, when after overlying the phase shift window layouts with other features, and accounting for overlapping of phase shift areas with other phase shift areas, at least one segment of the width of the phase shift area has a width equal to the layout width.

Figure 6:
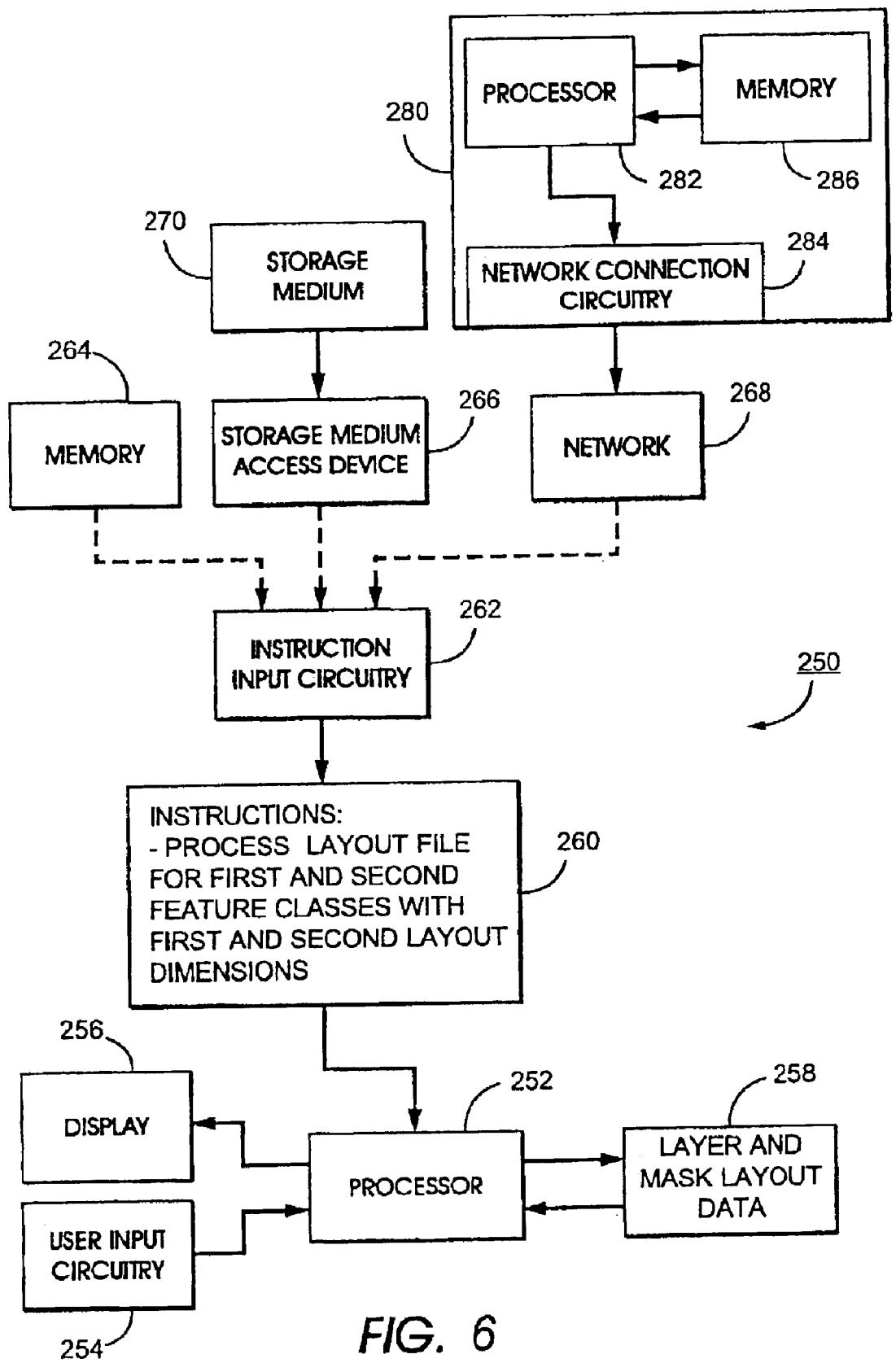
FIG. 6 illustrates a data processing system for executing the processes of laying out multiple feature classes in a single pattern, such as a pattern for photolithographic mask used for a single layer in an integrated circuit, or other work piece.

The generation of phase shift masks for a complex structure is a non-trivial processing problem. FIG. 6 illustrates a data processing system for such task. Machine 250 in FIG. 6 includes processor 252 connected for receiving data indicating user signals from user input circuitry 254 and for providing data defining images to display 256. Processor 252 is also connected for accessing mask and layer layout data 258, which define a mask layout under construction and a layout for a layer of material to be exposed using the mask. Processor 252 is also connected for receiving instruction data 260 indicating instructions through instruction input circuitry 262, which can illustratively provide instructions received from connections to memory 264, storage medium access device 266, or network 268.

In executing the commands indicated by instruction data 260, processor 252 uses layout data 258 to provide data defining a layout for a mask, and optionally an image of the mask layout to display 256 to cause it to present a representation of the layout.

In executing the instructions indicated by instruction data 260, processor 252 also receives user signal data from user input device 254, as necessary for control of, or interaction with, the process.

As noted above, FIG. 6 illustrates three possible sources from which instruction input circuitry 262 could receive data indicating instructions: memory 264, storage medium access device 266, and network 268.

Memory 264 could be any conventional memory within machine 250, including random access memory (RAM) or read-only memory (ROM), or could be a peripheral or remote memory device of any kind.

Storage medium access device 266 could be a drive or other appropriate device or circuitry for accessing storage medium 270, which could, for example, be a magnetic medium such as a set of one or more tapes, diskettes, or floppy disks; an optical medium such as a set of one or more CD-ROMs; or any other appropriate medium for storing data. Storage medium 270 could be a part of machine 250, a part of a server or other peripheral or remote memory device, or a software product. In each of these cases, storage medium 270 is an article of manufacture that can be used in machine 250. Data units can be positioned on storage medium 270 so that storage medium access device 266 can access the data units and provide them in a sequence to processor 252 through instruction input circuitry 262. When provided in the sequence, the data units form instruction data 260, indicating instructions as illustrated.

Network 268 can provide instruction data 260 received as a communication from machine 280. Processor 282 in machine 280 can establish a connection with processor 252 over network 268 through network connection circuitry 284 and instruction input circuitry 262. Either processor could initiate the connection, and the connection could be established by any appropriate protocol. Then processor 282 can access instruction data stored in memory 286 and transfer the instruction data over network 268 to processor 252 so that processor 252 can receive instruction data 260 from network 268. Instruction data 260 can then be stored in memory 264 or elsewhere by processor 252, and can be executed.

The resulting layout data is stored in a machine readable form, or presented in a communication to a remote system.

Automatic assignment of phase shift regions, and addition of optical proximity correction features, as described above are provided in this example to facilitate processing. Three stages in the generation of phase shift mask layouts according to the process which is implemented using a design rule checking programming language (e.g. Vampire (™) Design Rule Checker provided by Cadence Design Systems, Inc.) in a data processing system, like, for one example that of FIG. 6, include definition of input layers, generation of output layers, and coloring of the phase shifting regions.

A design rule checker can be utilized to identify all exposed features (i.e. lines) of an input layout that have a size less than a minimum feature dimension, or otherwise have characteristics of feature classes to be implemented according to the present invention using multiple phase shift resolution levels. Different minimum feature dimensions are applied to the multiple feature classes in one embodiment. Thus, minimum feature structures can be identified by subtracting slightly more than ½ of a minimum feature dimension for lines from the original size of an input structure. This results in eliminating all structures which have a dimension less than the minimum dimension. The remaining structures can then be reconstituted by adding slightly more than half of the minimum dimension back. Minimum dimension structures can then be identified by taking the original input structure and subtracting all structures which result from the reconstitution step. This process can be characterized as performing a size down operation to eliminate small dimension features followed by a size up operation on remaining edges to produce a calculated layout. The small dimension features are then identified performing an "AND NOT" operation between the original layout and the calculated layout.

Phase shift regions are formed in a simple case by copying the input structures in the respective feature classes, adjusting the width of the resulting polygons to the desired layout width for the respective feature classes, and placing the polygons corresponding to a phase shift window pair in the feature location. The phase "coloring" can be applied to the resulting phase shift window pairs automatically or manually, so that the 0 and 180 degree regions are properly laid out.

The simple examples described above provide alternate process flows for laying out phase shift windows for multiple resolution levels, based on the layout widths of the phase shift windows. The process is readily extended to complex layouts involving more than two resolution levels as suits the needs of a particular layout problem. Very fine gradations in resolution can be implemented, by fine-tuning the widths of the phase shift windows, and spacing between them.

Overall, greater control over the shape of laid out features, and lesser problems with phase conflict occur using the multiple resolution classes of the present invention for defining alternating phase shift masks used for the manufacture of integrated circuits and other fine featured work pieces.

The foregoing description of various embodiments of the invention have been presented for purposes of illustration and description. The description is not intended to limit the invention to the precise forms disclosed. Many modifications and equivalent arrangements will be apparent to people skilled in the art.

What is claimed is:

1. A method, comprising:
    processing a pattern for a photolithographic mask that defines a layer, wherein said pattern defines features in first and second feature classes in the layer;
    defining first layout dimensions for phase shift window pairs for a first feature resolution level, and second layout dimensions for phase shift window pairs for a second feature resolution level;
    laying out a plurality of phase shift window pairs, including using said first layout dimensions for phase shift window pairs for the first feature class, and using said second layout dimensions for phase shift window pairs for the second feature class; and assigning first and second phase shift values to phase shift windows in the plurality of phase shift window pairs.

2. The method of claim 1, said processing includes reading a layout file which identifies dimensions of the features in the pattern, and processing the layout file to identify features in the first and second feature classes.

3. The method of claim 1, wherein features in said first feature class have line segments having a first line width, and features in the second feature class have line segments having a second line width, the first line width being less than the second line width.

4. The method of claim 1, wherein features in said first feature class are line segments corresponding to transistor gates having a first width, and features in the second feature class are line segments corresponding to interconnect lines having a second width, the first width being less than the second width.

5. The method of claim 1, wherein the layer includes polysilicon.

6. The method of claim 1, wherein the first and second phase shift values include θ degree phase shifts and (180+θ) phase shifts.

7. The method of claim 1, wherein the phase shift window pairs also include opaque areas positioned between first and second windows in the pair.

8. The method of claim 7, wherein the opaque area between the first and second windows has a first width in said first class of phase shift window pairs and a second width in the second class of phase shift window pairs.

9. The method of claim 1, including laying out a complementary mask comprising opaque regions and transparent regions defining additional features in said layer.

10. The method of claim 9, wherein said complementary mask comprises a binary mask.

11. The method of claim 9, including producing a machine readable layout file defining the layout of the phase shift mask and of the complementary mask.

12. The method of claim 9, including producing the phase shift mask and the complementary mask.

13. The method of claim 12, including producing an integrated circuit using the phase shift mask and the complementary mask.

14. The method of claim 1, wherein said first layout dimensions include a first layout width, and the second layout dimensions include a second layout width, said first layout width being greater than said second layout width.

15. A set of masks for defining a layer of material in an integrated circuit, said set of masks comprising:

a first mask having a plurality of phase shifting windows in an opaque field for defining respective phase-shift window defined structures in said layer, the phase shift windows in said plurality comprising respective first and second classes of windows, the first class having a width dimension based upon a first layout width, and the second class having a width dimension based on a second layout width, said first layout width being greater than said second layout width; and a second mask having second opaque areas and clear areas, defining an interconnect structure in said layer for interconnecting a plurality of the phase-shift window defined structures, and for preventing erasure of the phase-shift window defined structures.

16. The set of masks of claim 15, wherein the layer includes polysilicon.

17. The set of masks of claim 15, including assigning phase shift values to a pair of windows in the first and second classes of windows, wherein one window in the pair of windows has a θ degree phase shift and the other window in the pair of windows has a (180+θ) phase shifts.

18. The set of masks of claim 17, wherein the pair of windows also includes an opaque area positioned between the one window and the other window.

19. The set of masks of claim 18, wherein the opaque areas have a first width between pairs of windows in said first class of windows and a second width between pairs of windows in said second class of windows.

20. An apparatus comprising:

a data processing system, including memory storing instructions, said instructions including commands which upon execution process a pattern for a photolithographic mask that defines a layer, wherein said pattern defines features in first and second feature classes in the layer;

define first layout dimensions for phase shift window pairs for a first feature resolution level, and second layout dimensions for phase shift window pairs for a second feature resolution level;

lay out a plurality of phase shift window pairs, using said first layout dimensions for phase shift window pairs for the first feature class, and using said second layout dimensions for phase shift window pairs for the second feature class; and assign first and second phase shift values to phase shift windows in the plurality of phase shift window pairs.

21. The apparatus of claim 20, wherein said instructions include commands to read a layout file which identifies dimensions of the features in the pattern, and to process the layout file to identify features in the first and second feature classes.

22. The apparatus of claim 20, wherein features in said first feature class have line segments having a first line width, and features in the second feature class have line segments having a second line width, the first line width being less than the second line width.

23. The apparatus of claim 20, wherein features in said first feature class are line segments corresponding to transistor gates having a first width, and features in the second feature class line are line segments corresponding to interconnect lines having a second width, the first width being less than the second width.

24. The apparatus of claim 20, wherein the layer includes polysilicon.

25. The apparatus of claim 20, wherein the first and second phase shift values include θ degree phase shifts and (180+θ) phase shifts.

26. The apparatus of claim 20, wherein the phase shift window pairs also include opaque areas positioned between first and second windows in the pairs.

27. The apparatus of claim 20, wherein the opaque area between the first and second windows has a first width in said first class of phase shift window pairs and a second width in the second class of phase shift window pairs.

28. The apparatus of claim 20, wherein said instructions include commands to lay out a complementary mask comprising opaque regions and transparent regions defining additional features in said layer.

29. The apparatus of claim 20, wherein said complementary mask comprises a binary mask.

30. The apparatus of claim 29, wherein said instructions include commands to produce a machine readable layout file defining the layout of the phase shift mask and of the complementary mask.

31. The apparatus of claim 20, wherein said first layout dimensions include a first layout width, and the second layout dimensions include a second layout width, said first layout width being greater than said second layout width.

32. An article of manufacture, comprising:
a machine readable storage medium storing instructions, said instructions including commands which upon execution
process a pattern for a photolithographic mask that defines a layer, wherein said pattern defines features in first and second feature classes in the layer;
define first layout dimensions for phase shift window pairs for a first feature resolution level, and second layout dimensions for phase shift window pairs for a second feature resolution level;
lay out a plurality of phase shift window pairs, using said first layout dimensions for phase shift window pairs for the first feature class, and using said second layout dimensions for phase shift window pairs for the second feature class; and
assign first and second phase shift values to phase shift windows in the plurality of phase shift window pairs.

33. The article of claim 32, wherein said instructions include commands to read a layout file which identifies dimensions of the features in the pattern, and to process the layout file to identify features in the first and second feature classes.

34. The article of claim 32, wherein features in said first feature class have line segments having a first line width, and features in the second feature class have line segments having a second line width, the first line width being less than the second line width.

35. The article of claim 32, wherein features in said first feature class are line segments corresponding to transistor gates having a first width, and features in the second feature class line are line segments corresponding to interconnect lines having a second width, the first width being less than the second width.

36. A machine readable communication, comprising:
a signal transmitted on a communication medium, the signal including instructions, said instructions including commands which upon execution
process a pattern for a photolithographic mask that defines a layer, wherein said pattern defines features in first and second feature classes in the layer;
define first layout dimensions for phase shift window pairs for a first feature resolution level, and second layout dimensions for phase shift window pairs for a second feature resolution level;
lay out a plurality of phase shift window pairs, using said first layout dimensions for phase shift window pairs for the first feature class, and using said second layout dimensions for phase shift window pairs for the second feature class; and
assign first and second phase shift values to phase shift windows in the plurality of phase shift window pairs.

37. The communication of claim 36, wherein said instructions include commands to read a layout file which identifies dimensions of the features in the pattern, and to process the layout file to identify features in the first and second feature classes.

38. The communication of claim 36, wherein features in said first feature class have line segments having a first line width, and features in the second feature class have line segments having a second line width, the first line width being less than the second line width.

39. The communication of claim 36, wherein features in said first feature class are line segments corresponding to transistor gates having a first width, and features in the second feature class line are line segments corresponding to interconnect lines having a second width, the first width being less than the second width.

40. An apparatus, comprising:
means for processing a pattern for a photolithographic mask that defines a layer, wherein said pattern defines features in first and second feature classes in the layer;
means for defining first layout dimensions for phase shift window pairs for a first feature resolution level, and second layout dimensions for phase shift window pairs for a second feature resolution level;
means for laying out a plurality of phase shift window pairs, including using said first layout dimensions for phase shift window pairs for the first feature class, and using said second layout dimensions for phase shift window pairs for the second feature class; and
means for assigning first and second phase shift values to phase shift windows in the plurality of phase shift window pairs.

41. The apparatus of claim 40, said means for processing includes means for reading a layout file which identifies dimensions of the features in the pattern, and means for processing the layout file to identify features in the first and second feature classes.

42. The apparatus of claim 40, wherein features in said first feature class have line segments having a first line width, and features in the second feature class have line segments having a second line width, the first line width being less than the second line width.

43. The apparatus of claim 40, wherein features in said first feature class are line segments corresponding to transistor gates having a first width, and features in the second feature class are line segments corresponding to interconnect lines having a second width, the first width being less than the second width.

44. The apparatus of claim 40, wherein the layer includes polysilicon.

45. The apparatus of claim 40, wherein the first and second phase shift values include $\theta$ degree phase shifts and $(180+\theta)$ phase shifts.

46. The apparatus of claim 40, wherein the phase shift window pairs also include opaque areas positioned between first and second windows in the pair.

47. The apparatus of claim 46, wherein the opaque area between the first and second windows has a first width in said first class of phase shift window pairs and a second width in the second class of phase shift window pairs.

48. The apparatus of claim 40, including means for laying out a complementary mask comprising opaque regions and transparent regions defining additional features in said layer.

49. The apparatus of claim 48, wherein said complementary mask comprises a binary mask.

50. The apparatus of claim 48, including means for producing a machine readable layout file defining the layout of the phase shift mask and of the complementary mask.

* * * * *